United States Patent [19]

Ibsen et al.

[11] 4,086,525

[45] Apr. 25, 1978

[54] CIRCUIT FOR PREVENTING OVERDISCHARGE OF A BATTERY

[75] Inventors: Ole N. Ibsen, Bloomington; Thomas E. Anderson, Normal, both of Ill.

[73] Assignee: General Electric Company, New York, N.Y.

[21] Appl. No.: 755,103

[22] Filed: Dec. 28, 1976

[51] Int. Cl.² .............................................. H02J 7/00
[52] U.S. Cl. ........................................ 320/33; 320/40; 320/48; 340/249
[58] Field of Search ...................... 320/39, 40, 48, 13, 320/22, 32; 307/66; 340/249

[56] References Cited

U.S. PATENT DOCUMENTS

| 3,440,435 | 4/1969 | Sanders | 307/66 |
| 3,585,482 | 6/1971 | Zelina | 320/35 X |
| 3,786,342 | 1/1974 | Molyneux | 340/249 X |
| 3,997,888 | 12/1976 | Kremer | 340/249 |

Primary Examiner—Robert J. Hickey
Attorney, Agent, or Firm—Stephen A. Young; Walter C. Bernkopf; Robert A. Cahill

[57] ABSTRACT

A circuit for preventing overdischarge of a rechargeable lead acid storage battery. The circuit is comprised of means for sensing the rate of discharge of the battery, means for generating a safe final discharge voltage which varies inversely with the sensed rate of discharge of the battery, means for producing a triggering signal when the generated safe final discharge voltage is equal to or greater than the actual voltage of the battery, and means responsive to the trigger signal for disconnecting the battery from a load.

5 Claims, 3 Drawing Figures

CIRCUIT FOR PREVENTING OVERDISCHARGE OF A BATTERY

BACKGROUND OF THE INVENTION

1. Field of the Invention

This invention relates to a circuit for preventing overdischarge of a rechargeable battery.

2. Description of the Prior Art

In an uninterruptible power system (UPS) which includes an inverter, a rechargeable storage battery electrically coupled thereto and a rectifier coupled between an AC source and the inverter, the power from the AC source is rectified by the rectifier and supplied to the inverter. The inverter converts the rectified power to a dependable AC source for supplying a critical bus. At the same time, the rectified AC power is used to recharge or maintain a constant charge on the battery. In the event that the AC source fails, it would be necessary for the storage battery to provide the backup power which would be converted to AC for maintaining the AC power supplied to the critical bus. Typically, when lead acid storage batteries are fully charged, they float at, for example, approximately 2.2 volts per cell. Generally, the UPS is required to supply power from its battery for approximately fifteen minutes, and it has been known that the battery cannot be allowed to discharge below a critical end voltage without the possibility of irreversible sulfation beginning to occur. Once the battery discharges beyond the critical voltage, deterioration of the useful life of the battery begins, and if the battery is not recharged within a reasonably short time, it may not be able to be recharged again to its original capacity. In order to protect these batteries, battery manufacturers have provided users with a single value for the final end voltage per cell below which a battery should not be allowed to continue to be discharged. An example of this was shown in the graph in FIG. 2 of U.S. Pat. No. 3,118,137, which shows the end battery voltage to be a constant value regardless of changes or variations in load current. Inasmuch as the battery in UPS systems is an important and expensive component of the UPS system, it has been the desire of UPS manufacturers to ensure that the battery and the UPS would be shut down once the battery discharged to the designated critical value.

Applicants have discovered that if a lead acid storage battery were being discharged at less than rated load, and if this battery were allowed to continue to discharge to a voltage somewhat above a value that had been specified by battery manufacturers as the safe final end voltage per cell of the battery, then, in fact, irreversible sulfation could begin to occur and deterioration of the useful life and capacity of the battery would unexpectedly result. It was applicants further discovery that this final end voltage to which a battery could safely discharge is not a constant in lead acid, and, in particular, in lead-calcium storage batteries, but, in fact, changes inversely with changes in the rate of discharge of current or power from the battery. Both of these discoveries were unexpected, and run contrary to the teaching of the prior art, and, in particular, to that of the above-referred to patent and to U.S. Pat. Nos. 3,895,284, 3,886,442 and 3,778,702. More specifically, the prior art as represented by the above patents generally teach that as the battery discharge current decreases, the capacity of the battery increases, thereby leading one to believe that the battery can effectively deliver power for longer periods of time, with no apparent recognition of the fact that the safe critical final end voltage per cell of the battery actually increases as the discharge current of the battery decreases.

OBJECT OF THE INVENTION

It is therefore an object of this invention to provide a circuit for preventing overdischarge of a rechargeable lead acid storage battery by recognizing that the safe final end voltage, beyond which battery performance deteriorates, is not a constant value, but unexpectedly increases when the load on the battery decreases.

This and other objects of the invention will be pointed out hereinafter.

SUMMARY OF THE INVENTION

According to a broad aspect of the invention, there is provided a circuit for preventing overdischarge of a lead acid storage battery, which battery is part of an uninterruptible power system that further includes an inverter, and a rectifier that is connected between an AC source and the inverter. The battery is used to supply power to the inverter when the AC source has failed or is not being used. The circuit for preventing overdischarge of the battery is comprised of means for sensing the rate of discharge of the battery, and means for generating a safe final discharge voltage which varies inversely with the sensed rate of discharge of the battery. The circuit further provides means for producing a triggering signal when the generated safe final discharge voltage is equal to or greater than the actual voltage of the battery. Also provided is means responsive to the triggering signal for disconnecting the battery from the inverter.

DESCRIPTION OF THE PREFERRED EMBODIMENT

Figure 1:
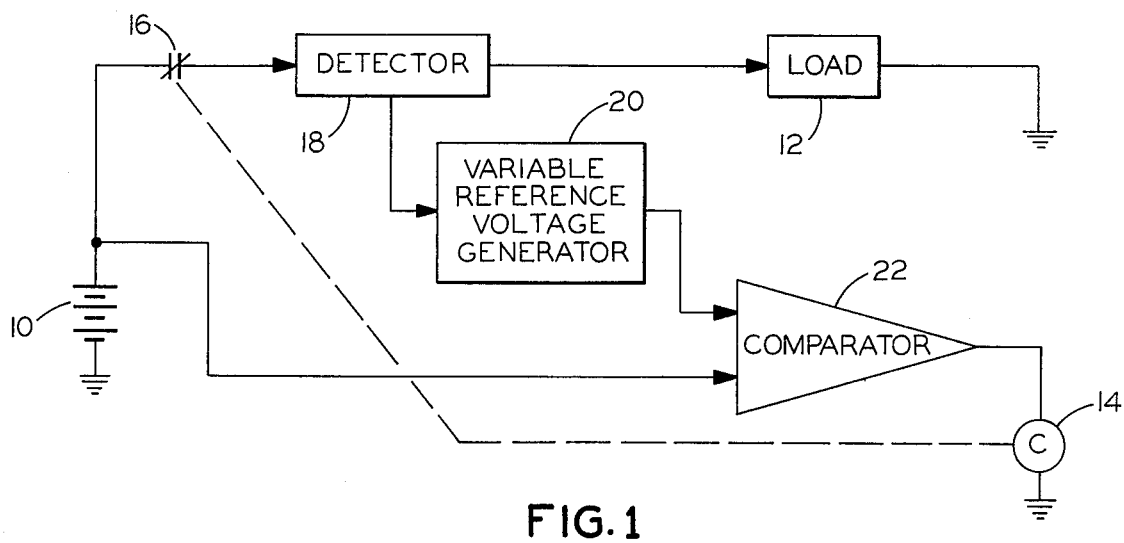
FIG. 1 is a block diagram of the circuit in accordance with the invention.
Figure 2:
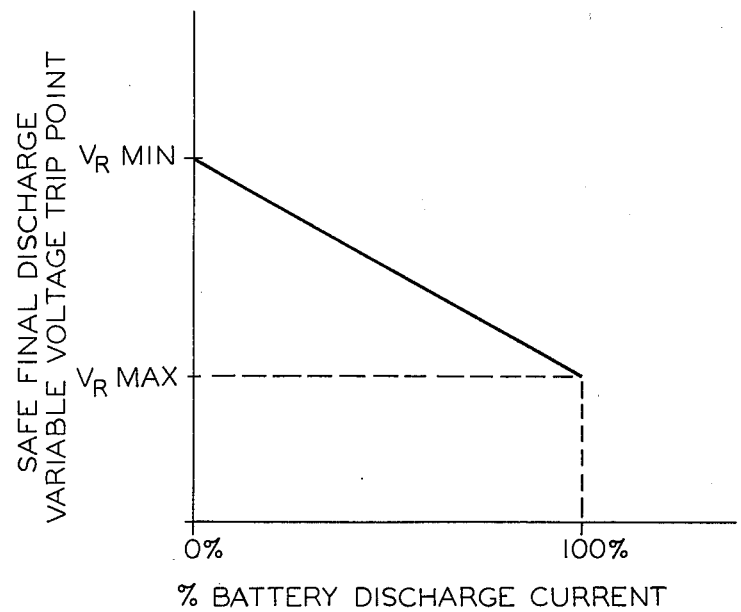
FIG. 2 is a graph showing the relationship between a variable safe final discharge voltage trip point and the % of battery discharge current.
Figure 3:
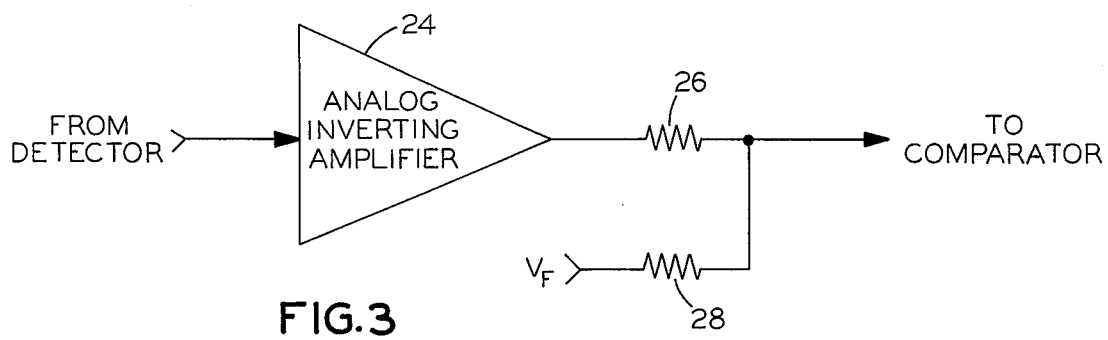
FIG. 3 is a circuit diagram of the variable reference voltage generator shown in FIG. 1.

Referring to FIGS. 1-3, the invention will now be described. As shown in FIG. 1, the circuit for preventing the overdischarge of a rechargeable battery 10 includes means for disconnecting the battery from an inverter or load 12 comprising a sensing coil 14 and a normally closed contact 16, a detector 18 which serves as a means for sensing the rate of discharge of the battery, a variable reference voltage generator 20, and a comparator 22.

Battery 10 is understood to be a rechargeable lead acid storage battery, which, in a preferred embodiment, is a lead-calcium storage battery. However, other lead acid storage batteries, such as lead antimony storage batteries, are also included within the scope of this invention. While the storage battery can be comprised of a plurality of cells, for the purposes of explaining this invention, we will refer to the voltage of the battery on a per cell basis. For example, when the battery is fully charged, it would be assumed that the floating voltage per cell is 2.2 volts, and at zero or minimum discharge current or power, the safe final voltage trip point, below which the battery should not continue to be discharged, on a per cell basis is approximately 1.85 volts ($V_{R\ min}$), while at a discharge rate of 100% load current the minimum safe final voltage trip point is approximately 1.55 volts per cell ($V_{R\ max}$). For the purpose of this invention, we will assume that the negative terminal of the battery shown in FIG. 1 is at circuit ground. Furthermore, referring to FIG. 2, it will be assumed that the safe final voltage trip point will vary linearly between 1.85 volts ($V_{R\ min}$) and 1.55 volts ($V_{R\ max}$), although there are circumstances when the variation may not be linear.

The disconnect means, which is comprised of coil 14 and normally closed contact 16, can be provided by a relay or a circuit breaker, or even an electronic solid state relay or other equivalent means. Normally closed contact 16, in this instance, is interposed between the positive terminal of battery 10 and an input terminal of detector 18. It should be understood that detector 18 can be any suitable current or power sensor which provides an indication of DC discharge current or power that is being supplied from the battery to the inverter or load. By way of example, detector 18 can be a standard DC shunt or current transformer which is placed in series with the battery and the inverter or load, and which provides a sensed output signal that is coupled to an input terminal of variable reference voltage generator 20. This input signal to variable reference voltage generator 20 is proportional to either the current or power sensed by detector 18. Variable reference voltage generator 20 is thus responsive to the sensed discharge rate of battery 10, and generates from its output a safe final discharge voltage ($V_R$) which varies inversely with the sensed rate of discharge of the battery as shown in FIG. 2. The output from the variable reference voltage generator thus provides a variable reference voltage which is applied to one input terminal of comparator 22. The other input terminal to the comparator is electrically coupled to the positive terminal of battery 10 to provide an indication of the actual voltage of the battery. Comparator 22, which can be any standard comparator circuit, compares the actual voltage of the battery with the generated variable safe final discharge charge voltage ($V_R$), and produces an output triggering signal whenever the generated voltage ($V_R$) is equal to or greater than, i.e. at least equal to, the actual voltage of the battery. The output of the comparator is electrically connected to one end of sensing coil 14, while the other end of sensing coil 14 can be connected to circuit ground, whereby when the triggering signal is applied to sensing coil 14, its associated normally closed contact 16 opens so as to disconnect battery 10 from the load or inverter. When load 12 is an inverter in a UPS system, the inverter can be any standard inverter circuit of the type described in U.S. Pat. No. Re. 26,342 assigned to General Electric Company or any other suitable inverter. While the output of load 12 is shown connected to circuit ground, in the event that the load is an inverter, then the output of the inverter will be applied to a critical bus. Furthermore, the UPS system will also include a rectifier (not shown) which is connected between the inverter and an AC power source.

Referring to FIG. 3, variable reference voltage generator 20 will be described in more detail. Included within the variable reference voltage generator is an analog inverting amplifier 24, first and second resistors 26 and 28 and a fixed reference voltage source $V_F$. The sensed signal from detector 18 is applied directly to the input of analog inverting amplifier 24, which serves to change the polarity and adjust the magnitude of the signal applied thereto. One end of resistor 26 and one end of resistor 28 are connected together to form an output terminal which is electrically coupled to the input of comparator 22 as shown in FIG. 1, while the other end of resistor 26 is electrically connected to the output terminal of analog inverting amplifier 24, and the other end of resistor 28 is electrically connected to the fixed reference voltage source ($V_F$). By way of example, in this instance, the ratio of resistor 26 to resistor 28 can be fixed at 10:1. The output signal from the variable reference voltage generator which is applied to comparator 22 is governed by the following equation:

$$V_R = V_F \left( \frac{R_1}{R_1 + R_2} \right) + V_2 \left( \frac{R_2}{R_1 + R_2} \right)$$

wherein $V_R$ is the generated variable reference voltage produced by variable reference voltage generator 20;

$V_F$ is the internal fixed reference voltage;

$R_1$ is resistor 26, and $R_2$ is resistor 28; and $V_a$ is the output voltage of inverting amplifier 24.

Assuming now at minimum load, the discharge current from battery 10 and the output voltage $V_a$ from amplifier 24 are zero, and the variable reference voltage is to be $V_{R\ min}$ (safe final discharge voltage trip point at minimum load). Under these circumstances, $V_{R\ min}$ will be 1.850 volts per cell, and the fixed reference voltage $V_F$ can be calculated as $V_F = 1.85\ (11/10)$ or 2.035 volts. At 100% discharge current from battery 10, when $V_{R\ max}$ equals 1.55 volts per cell while $V_F$ still equals 2.035 volts, then the output voltage $V_a$ of amplifier 24 is calculated to be $V_a = (1.55 - 2.035)11$ or $-5.335$ volts. In view of these calculations, the characteristics of analog inverting amplifier 24 can be adjusted so that its output voltage will vary from zero to $-5.335$ volts as the battery discharge current varies from zero to 100% of full load. From the above example, it can be seen how the parameters of variable reference voltage generator 20 can be established to provide the desired range for the variable safe final discharge voltage ($V_R$).

In operation, when the battery is required to supply current to the inverter or load, current will flow from the battery through normally closed contact 16 and detector 18 to the load. Detector 18 will sense the magnitude of DC discharge current flowing to the load, and will produce a signal at the input of analog inverting amplifier 24. The polarity of this signal will be reversed, and an appropriate voltage magnitude will appear at the output of the analog inverting amplifier in accordance with the parameters selected for the circuit so as to generate the proper variable safe final discharge voltage signal at the output of variable reference voltage generator 20. This signal will be applied to the input of comparator 22. As soon as the actual voltage of the battery becomes equal to or falls below the variable safe final discharge voltage, a triggering signal will be generated at the output of comparator 22. This triggering signal will cause sufficient current to flow through sensing coil 14, and normally closed contact 16 will open, thereby causing battery 10 to be isolated from its load. This circuit thus prevents the unwanted overdischarge of a rechargeable lead acid storage battery in such a manner as to allow the battery to be used as close to its capacity limits as possible, while preventing its use at a time when such use could result in its long term deterioration or possible destruction.

With regard to the embodiment described above, it should be understood that the basic concept for carrying out the invention broadly relates to the generation of a safe final discharge voltage which varies inversely with the sensed rate of discharge from the battery, wherein a disconnect or triggering signal is generated when the actual battery voltage becomes equal to or falls below the generated safe final discharge voltage. From the embodiment shown in FIGS. 1 and 3, an output voltage from the variable reference voltage generator, which is supplied to comparator 22, is the safe final discharge voltage of the battery for a sensed rate of discharge. While FIGS. 1 and 3 have provided one example of a circuit or means for providing the function just described, it should be clearly understood that other circuit variations which provide the same or equivalent function are also intended to be within the scope of this invention.

More specifically, an example of a clearly alternative and equivalent design would be provided, if, in FIG. 3, the output from analog inverting amplifier 24 would be connected directly to comparator 22 and $V_F$ were eliminated. Under these circumstances, the output voltage from this amplifier would vary between 1.85 volts to 1.55 volts as the battery load would vary between zero and 100%.

In another alternate embodiment, the fixed reference voltage $V_F$ could be combined with the actual battery voltage to provide one input to the comparator, while the other input to the comparator would be provided by the output from analog inverting amplifier 24. Under these circumstances, the safe final discharge voltage would still follow the curve shown in FIG. 2, and the output voltage of amplifier 24 would have to be adjusted in order for that relationship to be maintained.

Similarly, in another possible embodiment of the invention, the actual battery voltage could be applied to resistor 28 shown in FIG. 3 in place of the fixed reference voltage $(V_F)$, while the fixed reference voltage $(V_F)$ could be applied directly to that terminal of the comparator where the actual battery voltage was previously applied. Under these circumstances, a means for generating the safe final discharge voltage for the battery would be provided by analog amplifier 24, resistors 26, 28 and the fixed reference voltage $V_F$ which is now applied to the comparator, whereby when the actual battery voltage $(V_B)$ would be applied to resistor 28, the output of comparator 22 would generate a triggering signal for disconnecting the battery from the load as soon as the actual battery voltage became equal to or less than generated safe final discharge voltage for the battery at a given rate of discharge. Under these circumstances, it should be further understood that analog amplifier 24 would be a non-inverting analog amplifier, and in the previously described equation for $V_R$, the actual battery voltage $V_B$ would be substituted for $V_F$. Then $V_F$, which now would be applied directly to the input of comparator 22, would be set equal to $V_R$ and calculated at zero load by assuming that the output from the non-inverting amplifier is zero and $V_B$ from the battery is 1.85 volts. The output voltage $V_a$ for the non-inverting amplifier could then be calculated at full load conditions, as previously described from the equation for $V_R$, by assuming that $V_B$ is 1.55 volts and $V_R$ is still equal to the just calculated value for $V_F$. It should be further understood that the basic operation of the above described circuit variations is virtually the same in its broadest sense as that of the embodiment shown in FIGS. 1 and 3.

Although this invention has been described with reference to a specific embodiment thereof, numerous modifications are possible without departing from the invention, and it is desirable to cover all modifications falling within the spirit and scope of this invention.

What we claim as new and desire to secure by Letters Patent of the United States is:

1. A circuit for preventing overdischarge of a rechargeable lead acid storage battery comprising:
   (a) a direct current sensor for sensing the rate of discharge of said battery;
   (b) means responsive to said direct current sensor for generating a reference voltage which varies inversely with the sensed rate of discharge of said battery, said reference voltage generating means further comprising:
     (i) an analog inverting amplifier having an input terminal and an output terminal, said input terminal being electrically coupled to said direct current sensor; and
     (ii) first and second resistors each having one end electrically connected together to form an output of said reference voltage generating means, another end of said first resistor being electrically connected to the output terminal of said analog inverting amplifier, and another end of said second resistor being electrically connected to a fixed reference voltage source;
   (c) means for comparing the actual voltage of said battery with the generated reference voltage for producing a triggering signal when the generated reference voltage is at least equal to the actual voltage of said battery; and
   (d) means responsive to the triggering signal for disconnecting said battery from a load.

2. A circuit for preventing overdischarge of a rechargeable lead acid storage battery according to claim 1, wherein said disconnect means is comprised of a sensing coil electrically coupled to said comparing means, and a normally closed contact electrically connected in series with said battery, whereby when the triggering signal is received by said sensing coil, said normally closed contact opens, thereby disconnecting said battery from a load.

3. A circuit for preventing overdischarge of a rechargeable lead acid storage battery according to claim 1, wherein said battery is a lead-calcium storage battery.

4. A circuit for preventing overdischarge of a rechargeable lead acid storage battery according to claim 1, wherein said battery is a lead antimony storage battery.

5. In an uninterruptible power system including an inverter and a rechargeable lead acid storage battery electrically coupled thereto, further included is a circuit for preventing overdischarge of said battery comprising:
   (a) a direct current sensor for sensing the rate of discharge of said battery;
   (b) means responsive to said direct current sensor for generating a reference voltage which varies inversely with the sensed rate of discharge of said battery, said reference voltage generating means further comprising:
     (i) an analog inverting amplifier having an input terminal and an output terminal, said input terminal being electrically coupled to said direct current sensor; and (ii) first and second resistors each having one end electrically connected together to form an output of said reference voltage generating means, another end of said first resistor being electrically connected to the output terminal of said analog inverting amplifier, and another end of said second resistor being electrically connected to a fixed reference voltage source;

(c) means for comparing the actual voltage of said battery with the generated reference voltage for producing a triggering signal when the generated reference voltage is equal to or greater than the actual voltage of said battery; and (d) means responsive to the triggering signal for disconnecting said battery from said inverter.

* * * * *